United States Patent
Chang et al.

(10) Patent No.: US 9,424,917 B2
(45) Date of Patent: Aug. 23, 2016

(54) METHOD FOR OPERATING RRAM MEMORY

(71) Applicant: Taiwan Semiconductor Manufacturing Company, Ltd., Hsin-Chu (TW)

(72) Inventors: Chih-Yang Chang, Yuanlin Township (TW); Wen-Ting Chu, Kaohsiung (TW); Chia-Fu Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 318 days.

(21) Appl. No.: 13/788,063

(22) Filed: Mar. 7, 2013

(65) Prior Publication Data
US 2014/0254237 A1    Sep. 11, 2014

(51) Int. Cl.
   G11C 13/00    (2006.01)

(52) U.S. Cl.
   CPC .......... G11C 13/0069 (2013.01); G11C 13/003 (2013.01); G11C 13/0007 (2013.01); G11C 13/0023 (2013.01); G11C 13/0097 (2013.01); *G11C 2213/79* (2013.01)

(58) Field of Classification Search
   CPC ........ G11C 11/40; G11C 11/00; G11C 11/16; G11C 13/0069
   USPC .................................................. 365/148, 158
   See application file for complete search history.

(56) References Cited

U.S. PATENT DOCUMENTS

| | | | |
|---|---|---|---|
| 6,677,637 B2 | 1/2004 | Bernstein et al. | |
| 6,737,728 B1 | 5/2004 | Block et al. | |
| 6,781,185 B2 | 8/2004 | Chen et al. | |
| 6,803,641 B2 | 10/2004 | Papa Rao et al. | |
| 6,849,891 B1 | 2/2005 | Hsu et al. | |
| 6,936,881 B2 | 8/2005 | Yeo et al. | |
| 6,937,457 B2 | 8/2005 | Shih et al. | |
| 6,940,705 B2 | 9/2005 | Yeo et al. | |
| 7,195,970 B2 | 3/2007 | Tu et al. | |
| 7,407,858 B2 | 8/2008 | Li et al. | |
| 7,557,399 B2 | 7/2009 | Tu et al. | |
| 8,000,128 B2 | 8/2011 | Li et al. | |
| 8,009,454 B2 | 8/2011 | Lee et al. | |
| 8,456,899 B2 * | 6/2013 | DeBrosse et al. | 365/158 |
| 2007/0091671 A1 * | 4/2007 | Ooishi et al. | 365/158 |
| 2011/0103134 A1 * | 5/2011 | Oh | G11C 13/0007 365/148 |
| 2011/0188301 A1 * | 8/2011 | Wang | G11C 11/16 365/158 |
| 2014/0185362 A1 * | 7/2014 | Haukness | G11C 13/0002 365/148 |
| 2014/0209892 A1 * | 7/2014 | Kuo | G11C 8/10 257/43 |

* cited by examiner

*Primary Examiner* — Huan Hoang
*Assistant Examiner* — Muna A Techane
(74) *Attorney, Agent, or Firm* — Slater Matsil, LLP

(57) ABSTRACT

Methods for operating memory are disclosed. A method includes applying a select word line voltage to a word line node of a first resistive random access memory (RRAM) cell; applying a first programming voltage to a source line node of the first RRAM cell; and setting the first RRAM cell comprising applying a second programming voltage to a bit line node of the first RRAM cell. The first programming voltage is greater than zero volts, and the second programming voltage is greater than the first programming voltage. Other disclosed methods include concurrently setting and resetting RRAM cells.

19 Claims, 3 Drawing Sheets

METHOD FOR OPERATING RRAM MEMORY

BACKGROUND

In integrated circuit (IC) devices, resistive random access memory (RRAM) is an emerging technology for next generation non-volatile memory devices. RRAM is a memory structure that stores a bit of data using a resistance value, rather than electronic charge. Particularly, each RRAM cell includes a resistive material layer, the resistance of which can be adjusted to represent logic "0" or logic "1." RRAM devices operate under the principle that a dielectric, which is normally insulating, can be made to conduct through a filament or conduction path formed after the application of a sufficiently high voltage. The forming of a filament or conduction path is the forming operation or forming process of the RRAM. The sufficiently high voltage is the "form" voltage. The conduction path formation can arise from different mechanisms, including defect, metal migration, and other mechanisms. Various different dielectric materials may be used in RRAM devices. Once the filament or conduction path is formed, it may be reset, e.g., broken, resulting in high resistance or set, e.g., re-formed, resulting in lower resistance, by an appropriately applied voltage.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
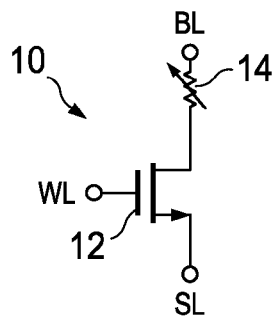
FIG. 1 is a resistive random access memory (RRAM) cell.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Methods of operating a resistive random access memory (RRAM) cell and an array of RRAM cells are disclosed. Aspects of embodiments may further be applied to other NOR-type memory or non-volatile memory cells and arrays. Although these methods are discussed in a particular order, embodiments may be performed in any logical order, and further, may be performed concurrently. Like reference numerals or indicators refer to like components throughout the figures.

FIG. 1 illustrates a RRAM cell 10. The RRAM cell 10 comprises an n-type field effect transistor (nFET) 12, such as a planar type NMOS, and a variable resistance memory element 14. A first node of the variable resistance memory element 14 is electrically coupled to a bit line node BL, and a second node of the variable resistance memory element 14 is electrically coupled to a drain of the nFET 12. A source of the nFET 12 is electrically coupled to a source line node SL. A gate of the nFET 12 is electrically coupled to a word line node WL. The nFET 12 may also have a bulk contact that is electrically coupled as appropriate for a given application. The variable resistance memory element 14 includes a resistive material layer, the resistance of which can be adjusted to represent logic "0" or logic "1."

Figure 2:
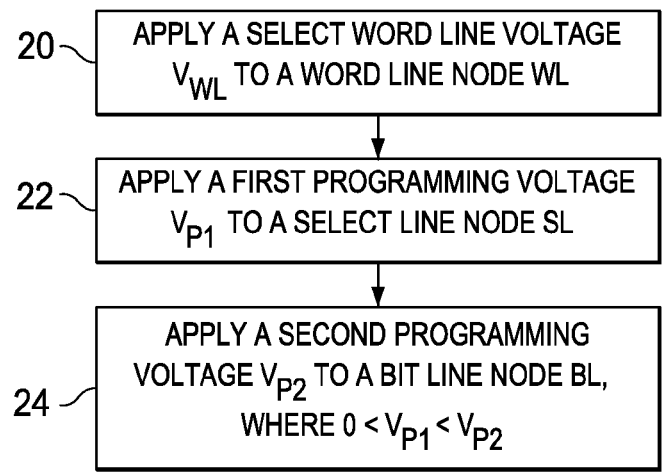
FIG. 2 is a method of Setting a variable resistance memory element in a RRAM cell according to an embodiment.

The variable resistance memory element 14 may be "Set," e.g., forming or re-forming a filament or conduction path through the variable resistance memory element 14, by applying appropriate voltages to nodes of the RRAM cell 10. For example, as shown in FIG. 2, a select word line voltage $V_{WL}$ is applied to the word line node WL (step 20), a first programming voltage $V_{P1}$ is applied to the source line node SL (step 22), and a second programming voltage $V_{P2}$ is applied to the bit line node BL (step 24). In an embodiment, the first programming voltage $V_{P1}$ is greater than zero volts, and the second programming voltage $V_{P2}$ is greater than the first programming voltage $V_{P1}$, such that $0\ V<V_{P1}<V_{P2}$. As an example, the first programming voltage $V_{P1}$ may be between about 0.8 V and about 1.4 V, and the second programming voltage $V_{P2}$ may be between about 1.8 V and about 2.4 V.

Figure 3:
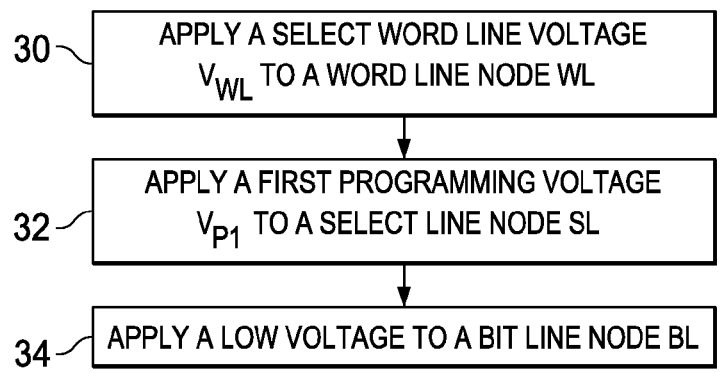
FIG. 3 is a method of Resetting a variable resistance memory element in a RRAM cell according to an embodiment.

The variable resistance memory element 14 may also be "Reset," e.g., breaking any filament or conduction path through the variable resistance memory element 14, by applying appropriate voltages to nodes of the RRAM cell 10. For example, as shown in FIG. 3, the select word line voltage $V_{WL}$ is applied to the word line node WL (step 30), the first programming voltage $V_{P1}$ is applied to the source line node SL (step 32), and a low voltage, e.g., 0 V, is applied to the bit line node BL (step 34).

The RRAM cell 10 may be unselected for programming by applying appropriate voltages to nodes of the RRAM cell 10. For example, a low voltage, e.g., 0 V, is applied to the word line node WL, the first programming voltage $V_{P1}$ is applied to the source line node SL, and/or the first programming voltage $V_{P1}$ is applied to the bit line node BL.

According to an embodiment, the actions shown in the following Table 1 may be achieved by applying the voltages shown.

TABLE 1

| Action | WL Select | WL Unselect | SL Select | SL Unselect | BL Select | BL Unselect |
|---|---|---|---|---|---|---|
| Reset | $V_{WL}$ | Low (e.g., 0 V) | $V_{P1}$ | | Low (e.g., 0 V) | $V_{P1}$ |
| Set | $V_{WL}$ | Low (e.g., 0 V) | $V_{P1}$ | | $V_{P2}$ | $V_{P1}$ |

Figure 4:
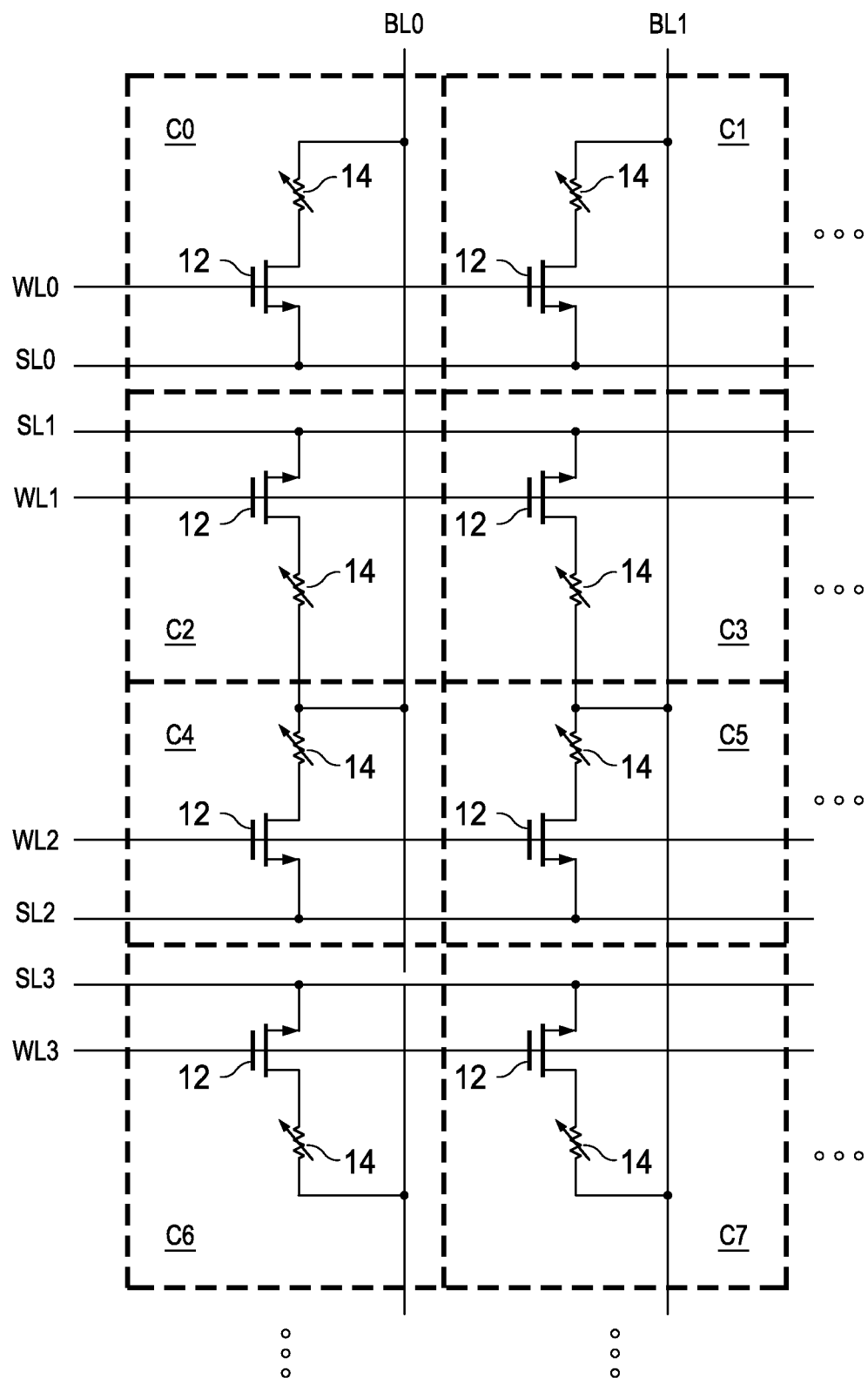
FIG. 4 is an array of RRAM cells.

FIG. 4 illustrates an array of RRAM cells. As shown, the array is 4×2, and other embodiments contemplate any size array, larger or smaller. The array comprises first, second, third, fourth, fifth, sixth, seventh, and eighth cells C0, C1, C2, C3, C4, C5, C6, and C7, respectively. Each of the cells C0 through C7 is configured as the RRAM cell 10 in FIG. 1. The first and second cells C0 and C1 have word line nodes electrically coupled to a first word line WL0, and have source line nodes electrically coupled to a first source line SL0. The third and fourth cells C2 and C3 have word line nodes electrically coupled to a second word line WL1, and have source line nodes electrically coupled to a second source line SL1. The fifth and sixth cells C4 and C5 have word line nodes electrically coupled to a third word line WL2, and have source line nodes electrically coupled to a third source line SL2. The seventh and eighth cells C6 and C7 have word line nodes electrically coupled to a fourth word line WL3, and have source line nodes electrically coupled to a fourth source line SL3. The first, third, fifth, and seventh cells C0, C2, C4, and C6 have bit line nodes electrically coupled to a first bit line BL0, and the second, fourth, sixth, and eighth cells C1, C3, C5, and C7 have bit line nodes electrically coupled to a second bit line BL1. Accordingly, cells within a row are electrically coupled to a respective word line and a respective source line, and cells within a column are electrically coupled to a respective bit line.

Cells of the array can be programmed, e.g., Set and Reset, consistent with the operation discussed above with respect to FIG. 1. Further, cells along a same word line, e.g., in a same row, may be concurrently Set and Reset. For example, the first cell C0 may be Set concurrently with the second cell C1 being Reset. In such an operation, the first bit line BL0 is set to the second programming voltage $V_{P2}$, and the second bit line BL1 is set to a low voltage, e.g., 0 V. The source lines SL0, SL1, SL2, and SL3 are set to the first programming voltage $V_{P1}$. The first word line WL0 is set to a select word line voltage $V_{WL}$, and the second, third and fourth word lines WL1, WL2, and WL3 are set to a low voltage, e.g., 0 V. In this manner, the first cell C0 and the second cell C1 are Set and Reset, respectively, according to Table 1, while the third through eighth cells C2 through C7 are unselected due to a low voltage on their respective word lines such that those cells are not Set or Reset. Additionally, assuming a third column is present in the array, the cell of the third column that is electrically coupled to the first word line WL0 may be unselected, and thus, not Set or Reset, if the bit line electrically coupled to that cell is the first programming voltage $V_{P1}$.

Figure 5:
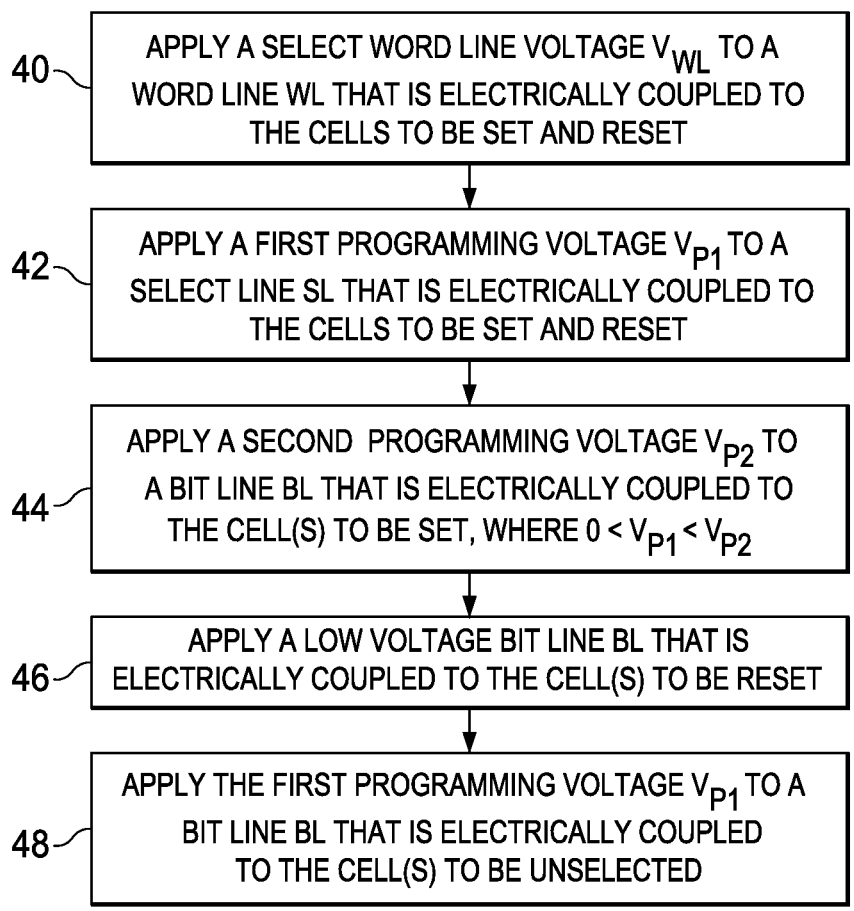
FIG. 5 is a method of Setting and Resetting RRAM cells according to an embodiment.

FIG. 5 illustrates a method of concurrently Setting, Resetting, and unselecting cells along a same word line and/or a same source line. In step 40, a select word line voltage $V_{WL}$ is applied to the word line WL that is electrically coupled to the cells to be Set and Reset. In step 42, a first programming voltage $V_{P1}$ is applied to the source line SL that is electrically coupled to the cells to be Set and Reset. In step 44, a second programming voltage $V_{P2}$ is applied to the bit line BL that is electrically coupled to the cell(s) to be Set. In step 46, a low voltage, e.g., 0 V, is applied to the bit line BL that is electrically coupled to the cell(s) to be Reset. In step 48, the first programming voltage $V_{P1}$ is applied to the bit line BL that is electrically coupled to the cell(s) to be unselected. The steps of the method in FIG. 5 may be performed during a single operation, such as during a single clock cycle, although the steps may be performed through multiple clock cycles.

A person having ordinary skill in the art will readily understand that the Set and Reset operations may be performed separately or concurrently for cells in an array that are electrically coupled to a bit line. Further, the methods described herein may be performed iteratively to Set and Reset the same cell(s) multiple times, or to Set and Reset different cells in the array by changing which combination of bit line and word line is selected.

Some embodiments may realize advantages. For example, some embodiments may realize concurrent Set and Reset operations to increase a write speed for an array of RRAM cells. Further, by having a voltage of a source line be the same regardless of the operation, e.g., unselect, Set, or Reset, an array of RRAM cells may be made faster and be simpler. Also, by having an unselect voltage of a bit line be the same, an array of RRAM cells may be made faster and be simpler.

An embodiment is a method. The method includes applying a select word line voltage to a word line node of a first resistive random access memory (RRAM) cell; applying a first programming voltage to a source line node of the first RRAM cell; and setting the first RRAM cell comprising applying a second programming voltage to a bit line node of the first RRAM cell. The first programming voltage is greater than zero volts, and the second programming voltage is greater than the first programming voltage.

Another embodiment is a method. The method comprises setting a first cell of a resistive random access memory (RRAM) array and resetting a second cell of the RRAM array concurrently with the setting of the first cell. The setting comprises applying a select word line voltage to a first word line; applying a first programming voltage to a source line; and applying a second programming voltage to a first bit line. A word line node of the first cell is electrically coupled to the first word line. A source line node of the first cell is electrically coupled to the source line. A bit line node of the first cell is electrically coupled to the first bit line. The first programming voltage is greater than zero, and the second programming voltage is greater than the first programming voltage. The resetting comprises applying a low voltage to a second bit line. A bit line node of the second cell is electrically coupled to the second bit line. A word line node of the second cell is electrically coupled to the first word line. A source line node of the second cell is electrically coupled to the source line.

A further embodiment is a method. The method comprises setting a first cell of a resistive random access memory (RRAM) array, and unselecting a second cell of the RRAM array concurrently with the setting of the first cell. The setting comprises applying a select word line voltage to a first word line, applying a first programming voltage to a source line, and applying a second programming voltage to a first bit line. A word line node of the first cell is electrically coupled to the first word line. A source line node of the first cell is electrically coupled to the source line. A bit line node of the first cell is electrically coupled to the first bit line. The first programming voltage is greater than zero, and the second programming voltage is greater than the first programming voltage. The unselecting comprises applying the first programming voltage to a second bit line. A bit line node of the second cell is electrically coupled to the second bit line. A word line node of the second cell is electrically coupled to the first word line. A source line node of the second cell is electrically coupled to the source line.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    applying a select word line voltage to a word line node of a first resistive random access memory (RRAM) cell;
    applying a first programming voltage to a source line node of the first RRAM cell, wherein the first programming voltage is greater than zero volts, wherein the source line node is electrically coupled to a first source line disposed between a word line and a second source line, and wherein no word lines are disposed between the first source line and the second source line;

setting the first RRAM cell comprising applying a second programming voltage to a bit line node of the first RRAM cell, wherein the second programming voltage is greater than the first programming voltage; and resetting a second RRAM cell concurrently with the setting the first RRAM cell comprising applying a low voltage to a bit line node of the second RRAM cell.

2. The method of claim 1 further comprising resetting the first RRAM cell comprising applying a low voltage to the bit line node of the first RRAM cell.

3. The method of claim 2, wherein the low voltage is zero volts.

4. The method of claim 1, wherein the word line node of the first RRAM cell and the word line node of the second RRAM cell are both electrically coupled to the word line.

5. A method comprising:
applying a select word line voltage to a word line node of a first resistive random access memory (RRAM) cell, wherein the word line node is electrically coupled to a word line;

applying a first programming voltage to a source line node of the first RRAM cell, wherein the first programming voltage is greater than zero volts, wherein a source line electrically coupled to the source line node of the first RRAM cell is disposed between the word line and an additional source line, wherein the additional source line is disposed between the source line and an additional word line, and wherein no word lines are disposed between the word line and the additional word line;

setting the first RRAM cell comprising applying a second programming voltage to a bit line node of the first RRAM cell, wherein the second programming voltage is greater than the first programming voltage; and unselecting a second RRAM cell concurrently with the setting the first RRAM cell comprising applying the first programming voltage to a bit line node of the second RRAM cell, wherein the word line node of the first RRAM cell and a word line node of the second RRAM cell are both electrically coupled to the word line.

6. The method of claim 5 further comprising unselecting a third RRAM cell concurrently with the setting the first RRAM cell comprising applying a low voltage to a word line node of the third RRAM cell, wherein the word line node of the first RRAM cell and the word line node of the third RRAM cell are electrically coupled to different word lines.

7. The method of claim 1, wherein the first programming voltage is between 0.8 volts and 1.4 volts, and the second programming voltage is between 1.8 volts and 2.4 volts.

8. A method comprising:
setting a first cell of a resistive random access memory (RRAM) array, the setting comprising:
applying a select word line voltage to a first word line, a word line node of the first cell being electrically coupled to the first word line;
applying a first programming voltage to a source line, a source line node of the first cell being electrically coupled to the source line, the first programming voltage being greater than zero; and
applying a second programming voltage to a first bit line, a bit line node of the first cell being electrically coupled to the first bit line, the second programming voltage being greater than the first programming voltage; and resetting a second cell of the RRAM array concurrently with the setting of the first cell, the resetting comprising applying a low voltage to a second bit line, a bit line node of the second cell being electrically coupled to the second bit line, a word line node of the second cell being electrically coupled to the first word line, a source line node of the second cell being electrically coupled to the source line, wherein the first cell and the second cell are disposed in a first row of the RRAM array, wherein a source line node of an additional cell is electrically coupled to a second source line separate from the source line, wherein the additional cell is disposed in a second row of the RRAM array adjacent the first row, and wherein no word lines are disposed between the source line and the second source line.

9. The method of claim 8 further comprising unselecting a third cell of the RRAM array concurrently with the setting the first cell, the unselecting comprising applying the first programming voltage to a third bit line, a bit line node of the third cell being electrically coupled to the third bit line, a word line node of the third cell being electrically coupled to the first word line, a source line node of the third cell being electrically coupled to the source line.

10. The method of claim 8 further comprising unselecting a third cell of the RRAM array concurrently with the setting the first cell, the unselecting comprising applying a low voltage to a second word line, a word line node of the third cell being electrically coupled to the second word line, the second word line being separate from the first word line.

11. The method of claim 8 further comprising resetting the first cell comprising applying a low voltage to the first bit line.

12. The method of claim 8 further comprising setting the second cell comprising applying the second programming voltage to the second bit line.

13. The method of claim 8, wherein the first programming voltage is between 0.8 volts and 1.4 volts, and the second programming voltage is between 1.8 volts and 2.4 volts.

14. A method comprising:
setting a first cell of a resistive random access memory (RRAM) array, the setting comprising:
applying a select word line voltage to a first word line, a word line node of the first cell being electrically coupled to the first word line;
applying a first programming voltage to a source line, a source line node of the first cell being electrically coupled to the source line, the first programming voltage being greater than zero, wherein the source line node is disposed between the first word line and an additional source line, and wherein no word lines are disposed between the source line and the additional source line; and
applying a second programming voltage to a first bit line, a bit line node of the first cell being electrically coupled to the first bit line, the second programming voltage being greater than the first programming voltage; and unselecting a second cell of the RRAM array concurrently with the setting of the first cell, the unselecting comprising applying the first programming voltage to a second bit line, a bit line node of the second cell being electrically coupled to the second bit line, a word line node of the second cell being electrically coupled to the first word line, a source line node of the second cell being electrically coupled to the source line.

15. The method of claim 14 further comprising resetting a third cell of the RRAM array concurrently with the setting the first cell, the resetting comprising applying a low voltage to a third bit line, a bit line node of the third cell being electrically coupled to the third bit line, a word line node of the third cell being electrically coupled to the first word line.

16. The method of claim 14 further comprising unselecting a third cell of the RRAM array concurrently with the setting the first cell, the unselecting comprising applying a low voltage to a second word line, a word line node of the third cell being electrically coupled to the second word line, the second word line being separate from the first word line.

17. The method of claim 14 further comprising selecting the second cell to set or reset the second cell, the selecting comprising:
   applying the select word line voltage to the first word line;
   applying the first programming voltage to the source line; and
   applying the second programming voltage to the second bit line to set the second cell, or a low voltage to the second bit line to reset the second cell.

18. The method of claim 14 further comprising resetting the first cell comprising applying a low voltage to the first bit line.

19. The method of claim 14, wherein the first programming voltage is between 0.8 volts and 1.4 volts, and the second programming voltage is between 1.8 volts and 2.4 volts.

* * * * *